(12) United States Patent
Subbareddy et al.

(10) Patent No.: US 11,595,045 B2
(45) Date of Patent: Feb. 28, 2023

(54) PROGRAMMABLE LOGIC DEVICE WITH FINE-GRAINED DISAGGREGATION

(71) Applicant: Intel Corporation, Santa Clara, CA (US)

(72) Inventors: Dheeraj Subbareddy, Portland, OR (US); MD Altaf Hossain, Portland, OR (US); Ankireddy Nalamalpu, Portland, OR (US); Robert Sankman, Phoenix, AZ (US); Ravindranath Mahajan, Chandler, AZ (US); Gregg William Baeckler, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 17/359,466

(22) Filed: Jun. 25, 2021

(65) Prior Publication Data

US 2021/0328589 A1    Oct. 21, 2021

Related U.S. Application Data

(60) Division of application No. 16/788,760, filed on Feb. 12, 2020, now Pat. No. 11,070,209, which is a continuation of application No. 16/123,765, filed on Sep. 6, 2018, now Pat. No. 10,601,426.

(51) Int. Cl.
*H03K 19/1776* (2020.01)
*H01L 25/18* (2006.01)
*H01L 23/367* (2006.01)

(52) U.S. Cl.
CPC ....... *H03K 19/1776* (2013.01); *H01L 23/367* (2013.01); *H01L 25/18* (2013.01); *H01L 2225/06513* (2013.01); *H01L 2225/06565* (2013.01); *H01L 2225/06589* (2013.01)

(58) Field of Classification Search
CPC ... H03K 19/1776; H01L 23/367; H01L 25/18; H01L 2225/06513; H01L 2225/06565; H01L 2225/06589; H01L 2225/06541
See application file for complete search history.

(56) References Cited

U.S. PATENT DOCUMENTS

| 5,550,782 | A  | 8/1996  | Cliff et al.    |
| 5,787,007 | A  | 7/1998  | Bauer           |
| 7,812,458 | B2 | 10/2010 | Madurawe        |
| 8,922,243 | B2 | 12/2014 | Jayasena et al. |
| 9,106,229 | B1 | 8/2015  | Hutton et al.   |

(Continued)

*Primary Examiner* — Daniel D Chang
(74) *Attorney, Agent, or Firm* — Fletcher Yoder, P.C.

(57) ABSTRACT

A programmable device may have logic circuitry formed in a top die and memory and specialized processing blocks formed in a bottom die, where the top die is stacked directly on top of the bottom die in a face-to-face configuration. The logic circuitry may include logic sectors, logic array blocks, logic elements, and other types of logic regions. The memory blocks may include large banks of multiport memory for storing data. The specialized processing blocks may include multipliers, adders, and other arithmetic components. The logic circuitry may access the memory and specialized processing blocks via an address encoded scheme. Configured in this way, the maximum operating frequency of the programmable device can be optimized such that critical paths will no longer need to traverse any unused memory and specialized processing blocks.

20 Claims, 11 Drawing Sheets

(56) References Cited

U.S. PATENT DOCUMENTS

| | | |
|---|---|---|
| 9,294,092 B2 | 3/2016 | Hutton |
| 9,344,091 B2 | 5/2016 | Jayasena et al. |
| 9,633,872 B2 | 4/2017 | Chen et al. |
| 9,935,052 B1 | 4/2018 | Liu et al. |
| 2003/0102495 A1* | 6/2003 | Huppenthal ........ G06F 15/7867 257/209 |
| 2004/0178819 A1 | 9/2004 | New |
| 2004/0222817 A1* | 11/2004 | Madurawe .......... H01L 27/1116 326/39 |
| 2014/0181458 A1 | 6/2014 | Loh et al. |
| 2018/0176006 A1 | 6/2018 | McElheny et al. |
| 2019/0044515 A1 | 2/2019 | Gutala et al. |

* cited by examiner

PROGRAMMABLE LOGIC DEVICE WITH FINE-GRAINED DISAGGREGATION

CROSS-REFERENCE TO RELATED APPLICATIONS

This application is a divisional of U.S. patent application Ser. No. 16/788,760, filed Feb. 12, 2020, which is a continuation of U.S. patent application Ser. No. 16/123,765, filed Sep. 6, 2018, now U.S. Pat. No. 10,601,426, both of which are hereby incorporated by reference in their entireties for all purposes.

BACKGROUND

This relates generally to integrated circuits and more particularly, to programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements on a programmable integrated circuit to configure the device to perform the functions of the custom logic circuit. Such types of programmable integrated circuits are sometimes referred to as a field-programmable gate array (FPGA).

An FPGA typically includes logic circuitry having lookup tables (LUTs), adders, and registers that are configurable to allow a user to customize the logic circuitry according to the user's particular needs. The logic circuitry is organized into an array of logic regions sometimes referred to as logic array blocks (LABs). In addition to the logic circuitry, an FPGA also includes large memory blocks for storing user data and digital signal processing (DSP) blocks that are partly or fully hardwired to perform one or more specific tasks such as a mathematical operation. In addition to the configurable logic, memory, and DSP blocks, an FPGA also includes programmable routing fabric that is used to interconnect the LABs with the memory and DSP blocks. The combination of the programmable logic and routing fabric is sometimes referred to as "soft" logic. The DSP blocks are sometimes referred to as "hard" logic.

The performance of an FPGA is limited by the longest signal propagation delay through a combinational logic path between two sequential digital flip-flop circuits. Conventionally, an FPGA is implemented as a single integrated circuit die. In such scenarios, there will often be a long combinational logic path that starts in a first LAB, traverses an unused memory block or DSP block, and ends in a second LAB, which sets the critical path for the FPGA. This particular architecture can substantially limit the performance of the FPGA.

It is within this context that the embodiments described herein arise.

DETAILED DESCRIPTION

The present embodiments relate to ways for improving the performance of a programmable integrated circuit. A programmable integrated circuit device may include logic circuitry, memory blocks, specialized processing blocks, and programmable routing fabric interconnecting the various components on the programmable device. Combinational paths that need to traverse the memory blocks and/or the specialized processing blocks from one logic region to another can add substantial wire delay and limit the performance of the programmable device.

In accordance with an embodiment, the programmable device may be disaggregated into separate integrated circuit dies, where all of the memory blocks and specialized processing blocks are formed in a first integrated circuit die and where all of the logic circuitry is formed separately in a second integrated circuit die that is stacked on top of the first integrated circuit die. Configured in this way, combinational paths connecting different logic regions would no longer traverse the memory blocks and specialized procession blocks. As a result, the capacitive loading of the interconnect paths is reduced, which lowers interconnect latency as well as power consumption. Moreover, feedthrough paths are eliminated, which results in better wire utilization and routing efficiency for routing fabric. All of these technical improvements can help increase the maximum operating speed (or fmax) of the programmable device.

It will be recognized by one skilled in the art, that the present exemplary embodiments may be practiced without some or all of these specific details. In other instances, well-known operations have not been described in detail in order not to unnecessarily obscure the present embodiments.

Figure 1:
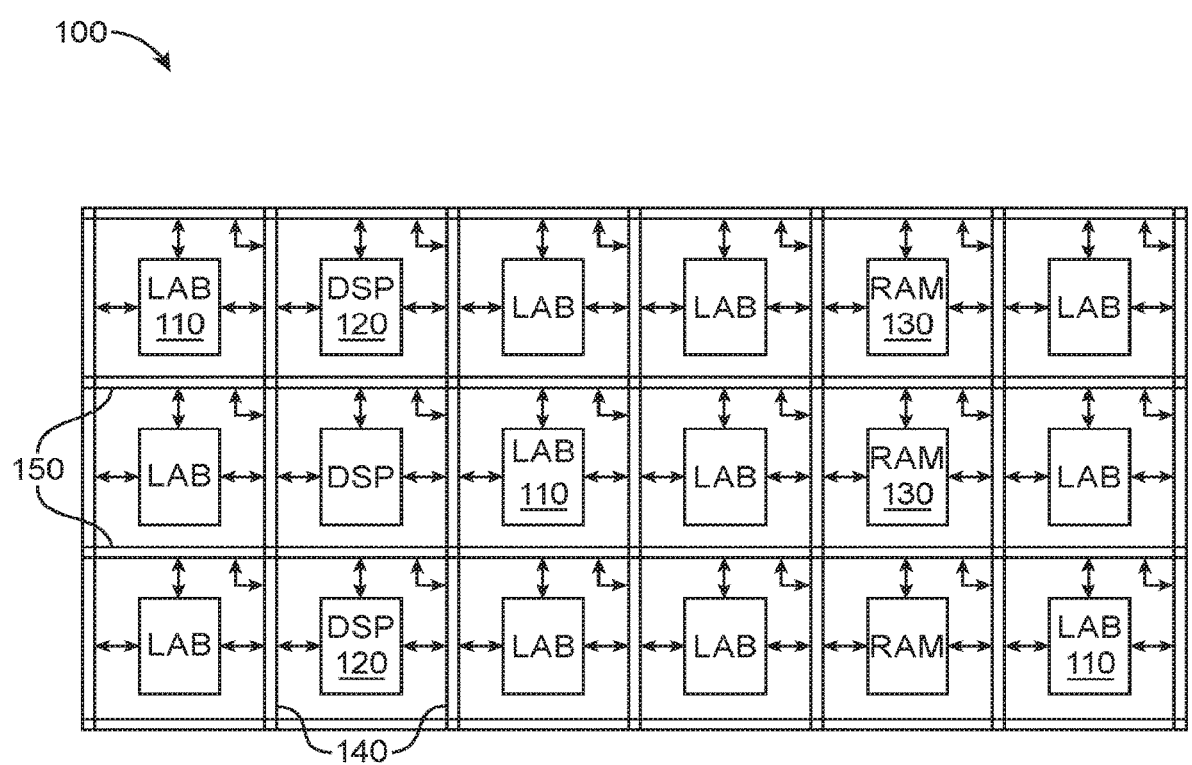
FIG. 1 is a diagram of illustrative programmable integrated circuitry in accordance with an embodiment.

An illustrative embodiment of a programmable integrated circuit such as programmable logic device (PLD) 100 that may be configured to implement a circuit design is shown in FIG. 1. As shown in FIG. 1, the programmable logic device (PLD) may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals. LABs 110 may also be grouped into larger programmable regions sometimes referred to as logic sectors that are individually managed and configured by corresponding logic sector managers. The grouping of the programmable logic resources on device 100 into logic sectors, logic array blocks (LABs), logic elements (LEs), or adaptive logic modules (ALMs) is merely illustrative. In general, device 100 may include functional logic blocks of any suitable size and type, which may be organized in accordance with any suitable logic resource hierarchy.

Programmable logic device 100 may contain programmable memory elements. Memory elements may be loaded with configuration data (also called programming data). Once loaded, the memory elements each provide a corresponding static control signal that controls the operation of an associated functional block (e.g., LABs 110, DSP 120, RAM 130, etc.).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration random-access memory (CRAM), or programmable memory elements. Programmable logic device (PLD) 100 may be configured to implement a custom circuit design. For example, the configuration RAM may be programmed such that LABs 110, DSP 120, and RAM 130, and programmable interconnect circuitry (i.e., vertical channels 140 and horizontal channels 150) form the circuit design implementation.

In addition, the programmable logic device may further include input-output (I/O) elements (not shown) for driving signals off of PLD 100 and for receiving signals from other devices. The input-output elements may include parallel input-output circuitry, serial data transceiver circuitry, differential receiver and transmitter circuitry, or other circuitry used to connect one integrated circuit device to another.

As described above, device 100 may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include pipeline elements, and the contents stored in these pipeline elements may be accessed during operation. For example, a programming circuit may provide read and write access to a pipeline element.

Note that other routing topologies, besides the topology of the interconnect circuitry depicted in FIG. 1, are intended to be included within the scope of the present invention. For example, the routing topology may include wires that travel diagonally or that travel horizontally and vertically along different parts as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Figure 2:
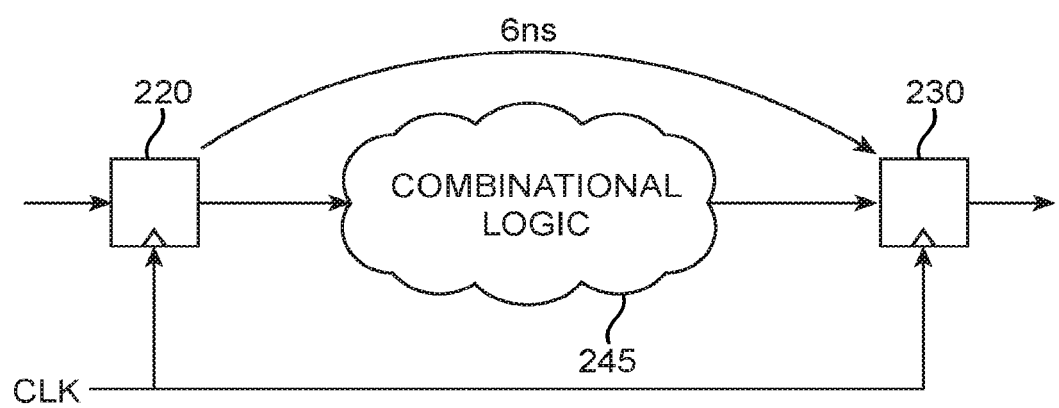
FIG. 2 is a diagram illustrating a critical path.

FIG. 2 is a diagram showing an illustrative critical path. As shown in FIG. 2, a first register 220 may send a signal to a second register 230 through combinational logic 245. As an example, the delay on the path from register 220 through combinational logic 245 to register 230 may have a delay of 6 nanoseconds (ns). If this particular combinational path has the longest delay between any two sequential elements on the device, then this path is sometimes referred to as the "critical path" and sets the maximum operating frequency of the device, which is equal to 166 MHz in this case (e.g., $\frac{1}{6}$e−9).

Figure 3:
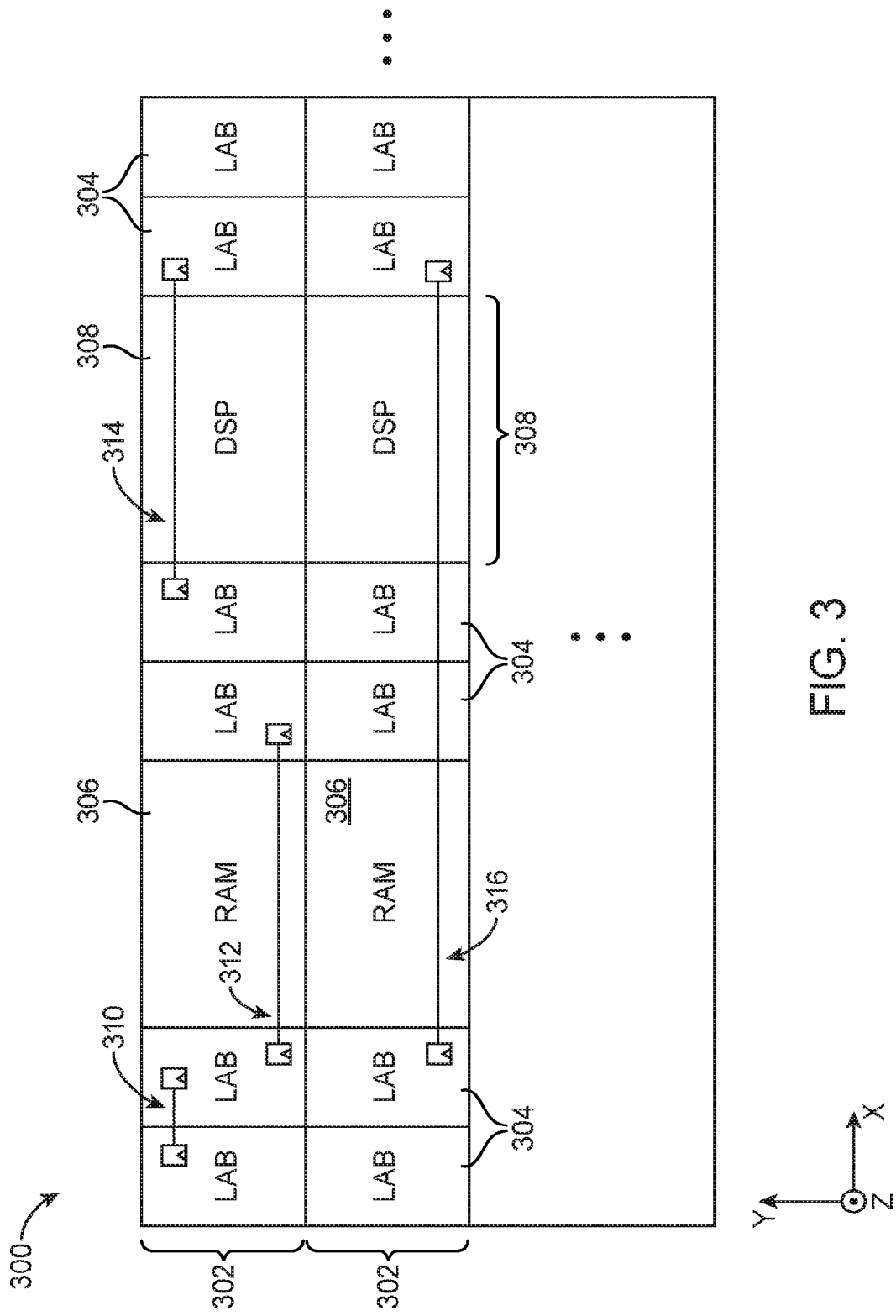
FIG. 3 is a top layout view of a conventional programmable integrated circuit die.

As described above in connection with FIG. 2, PLD performance may be dictated by the combinational path delay between sequential elements (e.g., registers, digital flip-flops, or other clocked storage elements) or input-output elements. FIG. 3 is a top layout view of a conventional programmable integrated circuit. Typically, a programmable integrated circuit is formed on a single die (i.e., on a single silicon substrate). The X-Y plane is parallel to the top surface of the silicon substrate. As shown in FIG. 3, conventional programmable integrated circuit 300 is organized into LAB rows 302. Each LAB row 302 includes LABs 304, one or more RAM blocks 306, and one or more DSP blocks 308.

The combinational logic is mostly formed in the LABs 304. In the example of FIG. 3, short combinational paths such as path 310 that routes signals between immediately adjacent LABs 310 exhibit relatively short delays. However, longer combinational paths such as path 312 that routes signals between two LABs while traversing an unused RAM block 306 (e.g., a RAM block that is unused by the combinational path or unused by any portion of the logic design), path 314 that routes signals between two LABs while traversing an unused DSP block 308 (e.g., a DSP block that is unused by the combinational path or unused by any portion of the logic design), and path 316 that routes signals between two LABs while traversing unused RAM and DSP blocks will exhibit much longer delays, which can significantly limit the performance of programmable integrated circuit die 300.

To help increase the speed at which configuration can occur on a programmable logic device, as well as to better control power consumption, reduce manufacturing costs, among other things, a programmable logic device may be formed as a first die that contains primarily programmable logic fabric and a second die that contains fabric support circuitry for supporting the operation of the programmable logic fabric in the first die. An arrangement of this type is described in detail in Gutala et al. (a commonly owned U.S. patent application Ser. No. 15/855,419, filed on Dec. 27, 2017), which is incorporated herein by reference.

Figure 4:
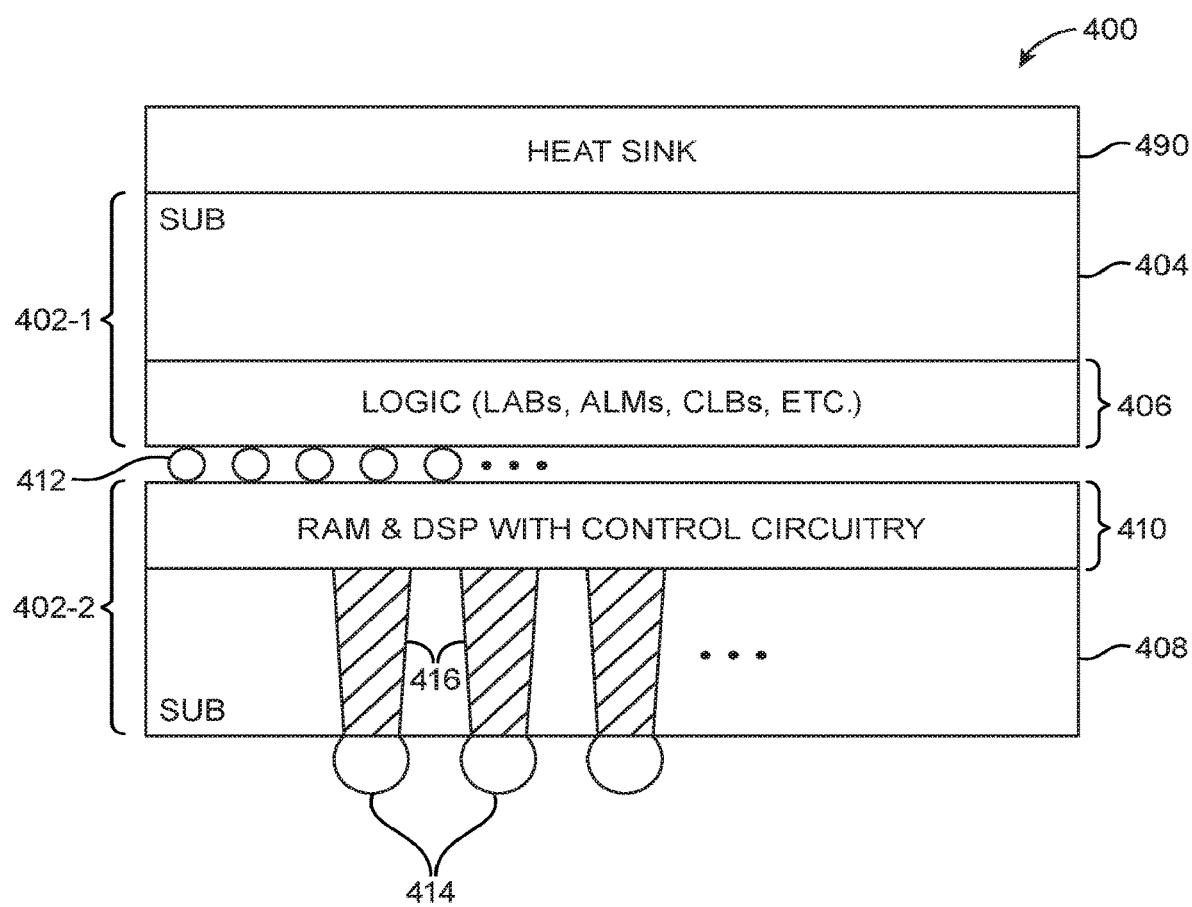
FIG. 4 is a cross-sectional side view of an illustrative programmable logic device with a disaggregated architecture in accordance with an embodiment.

In accordance with an embodiment, a programmable logic device may be implemented using a split or "disaggregated" architecture, where the logic circuitry such as the logic array blocks (LABs), logic elements (LEs), adaptive logic modules (ALMs), configurable logic blocks (CLBs), and other logic regions are formed in a first die 402-1 and where the other embedded functional blocks such as the RAM blocks and the DSP blocks are formed in a second die 402-2 (see, e.g., FIG. 4). In other words, the majority of RAM and DSP blocks should be formed in die 402-1 (i.e., some or all of the RAM and DSP blocks in the package is formed in die 402-1), whereas the majority of the logic circuitry should be formed in die 402-2 (i.e., some or all of the logic circuitry in the package is formed in die 402-2). In the extreme scenario, die 402-1 should not include any RAM and DSP blocks, whereas die 402-2 should not include any logic circuitry (e.g., die 402-1 includes only logic circuitry but no RAM/DSP blocks, and die 402-2 includes only RAM and DSP blocks but no logic blocks). Both dies 402-1 and 402-2 can, however, include programmable routing fabric for routing signals to the correct destination.

FIG. 4 shows a cross-sectional side view of an illustrative programmable device 400 implemented as a multichip package, where die 402-1 is stacked on top of die 402-2. Die 402-1 may include a semiconductor substrate 404 (e.g., a p-doped silicon substrate) having a top surface and a bottom surface. The logic circuitry 406 may be formed on the bottom surface of substrate 404. Die 402-2 may include a substrate 408 (e.g., a p-doped silicon substrate) having a top surface that faces the bottom surface of die 402-1 and a bottom surface. The RAM and DSP blocks and also control circuitry 410 may be formed on the top surface of substrate 408.

Microbumps 412 may be formed between dies 402-1 and 402-2 to help couple circuitry 406 to circuitry 410. Bumps such as controlled collapse chip connection (C4) bumps 414 may be formed at the bottom surface of substrate 408. Bumps 414 may be coupled to circuitry 410 using through-silicon vias (TSVs) 416. Generally, C4 bumps 414 (e.g., bumps used for interfacing with off-package components) are substantially larger in size compared to microbumps 412 (e.g., bumps used for interfacing with other dies within the same package). The number of microbumps 412 is also much greater than the number of bumps 414 (e.g., the ratio of the number of microbumps to the number of C4 bumps may be greater than 2:1, 5:1, 10:1, etc.). This arrangement in which circuitry 406 of die 402-1 directly faces circuitry 410 of die 402-2 is sometimes referred to as a "face-to-face" configuration.

The control circuitry in 410 may generally include memory address decoding logic, clocking logic such as phase-locked loops (PLLs), calibration logic for managing die-to-die variations, debugging logic for detecting and correct defects on device 400, and/or other infrastructure-related circuits. The control circuitry in 410 may also include input-output (I/O) elements for driving signals off of device 400 and for receiving signals from other devices such as other memory devices and logic devices that are not contained within top die 402-1. The input-output elements may include parallel input-output circuitry, serial data transceiver circuitry, differential receiver and transmitter circuitry, or other circuitry used to connect one integrated circuit device to another.

Forming the control circuitry in the bottom die 402-2 can help reduce the number of microbumps 412 that are needed. The RAM blocks are also generally considered the colder part of device 400. Hence, moving memories and the DSP blocks to the bottom die has no thermal impact. A heat dissipation structure such as heat sink 490 may be formed on top of die 402-1 to help dissipate the heat generated by device 400. If desired, die 402-1 and die 402-2 may be fabricated using different technology or process nodes. As an example, die 402-1 may be manufactured using a more advanced or newer process technology node while die 402-1 is manufactured using a less advanced or older process technology node. In this example, die 402-2 may be configured as an interposer or some other intermediary substrate with some active circuitry. As another example, die 402-2 may be manufactured using a more advanced or newer process technology node while die 402-1 is manufactured using a less advanced or older process technology node.

Figure 5A:
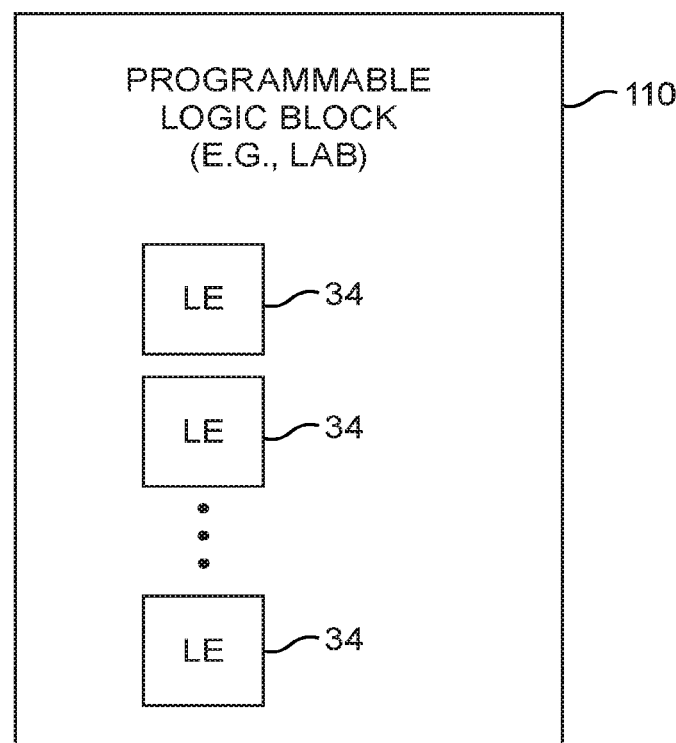
FIG. 5A is a diagram of an illustrative programmable logic block in accordance with an embodiment.

FIG. 5A is a diagram of an illustrative programmable logic block such as LAB 110. LAB 110 may include a smaller subset of LABs that is operable to access memory and that is therefore sometimes referred to as memory LABs ("MLABs"). LAB 110 may have associated input selection circuitry and output selection and driver circuitry. The input selection circuitry may include LAB input multiplexers (LIMs) configured to select one or more of the input signals to provide to programmable logic block 110. The output selection and driver circuitry may include driver input multiplexers (DIMs) that can be used to select signals from a horizontal channel, a vertical channel, and local outputs from one or more logic elements 34 and to drive wires, which originate in that logic block 110 and route to other logic blocks.

As shown in FIG. 5A, LAB 110 may include smaller regions of programmable logic 34 that include combinational logic. The smaller programmable logic regions 34 within each programmable logic region 110 are sometimes referred to as adaptive logic modules (ALMs) or logic elements (LEs). Logic elements 34 may receive the input signals that are selected by the input selection circuitry and may perform custom functions on the input signals to produce output signals. The input signals received by each logic element 34 may overlap with input signal portions received by other logic elements 34 (e.g., some of the input signals received by a first logic region 34 may also be received by a second logic region 34). There may be any suitable number of logic elements 34 within logic block 100.

Figure 5B:
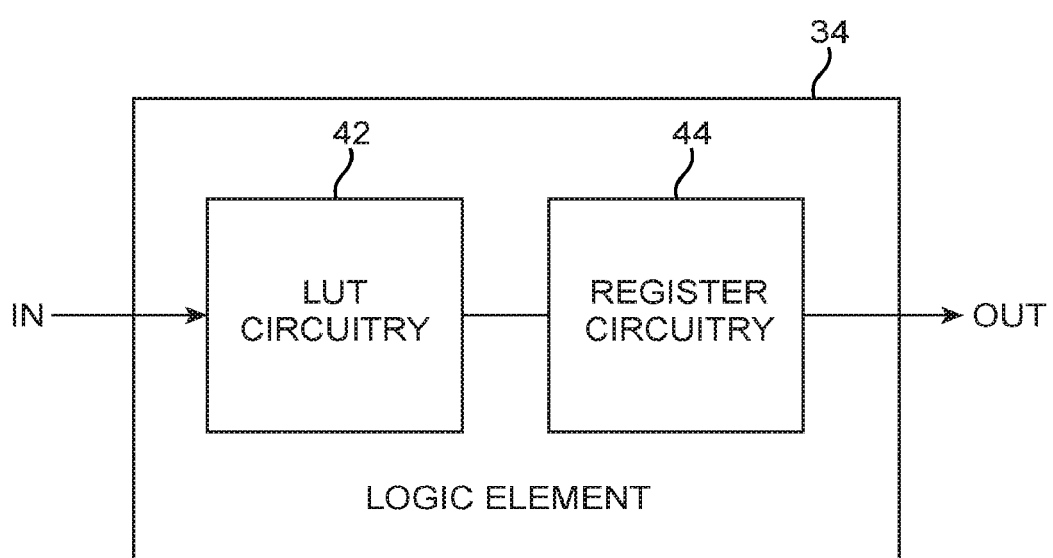
FIG. 5B is a diagram of an illustrative programmable logic element in accordance with an embodiment.

FIG. 5B is an illustrative example of a logic element 34. As shown in FIG. 5B, logic element 34 may include lookup table circuitry 42 and register circuitry 44. Lookup table (LUT) circuitry 42 may include look-up tables that process any desired number of inputs. For example, circuitry 42 may include a four-input lookup table (4LUT), a five-input lookup table (5LUT), a six-input lookup table (6LUT), an eight-input lookup table (8LUT), etc. If desired, lookup table circuitry 42 may have multiple configurations each providing a different number of inputs and/or outputs. The configuration of circuitry 42 and the logic functions implemented by the look-up tables may be determined based on configuration values stored in the memory cells of circuitry 42.

Input signals IN may be received by lookup table circuitry 42 (e.g., from the input selection circuitry described in connection with FIG. 5A) and processed based on the configuration of lookup table circuitry 42. Output signals produced by lookup table circuitry 42 may be stored by register circuitry 44 and produced as output signals OUT of logic region 34. If desired, registers in register circuitry 44 may be bypassed using direct paths from lookup table circuitry 42.

Register circuitry 44 may include one or more registers that store output signals from look-up table circuitry 42 based on one or more clock and control signals. The clock and control signals may be received from interconnects such as interconnects 140 and/or 150 of FIG. 1. If desired, the clock signals may be received from dedicated clock paths (e.g., a global clock tree). The input selection circuitry may be used to select which clock and control signals are provided to register circuitry 44.

The logic circuitry of the type shown in FIGS. 5A and 5B is merely illustrative. In general, the logic circuitry that is included within top die 402-1 (FIG. 4) may be any type of logic circuits that can be configured to implement a custom user design.

Figure 6A:
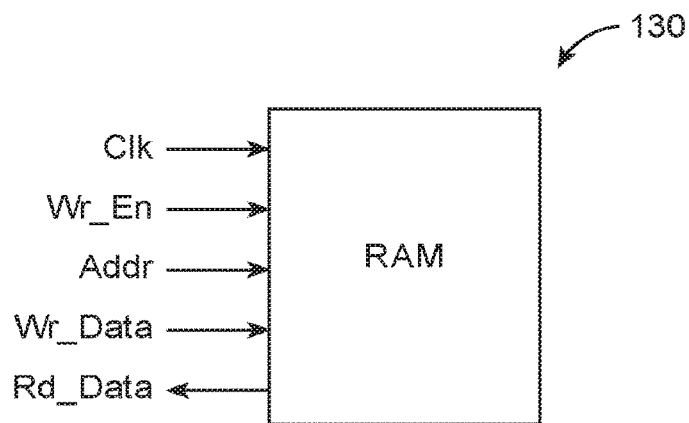
FIG. 6A is a diagram of an illustrative single-port memory block in accordance with an embodiment.
Figure 6B:
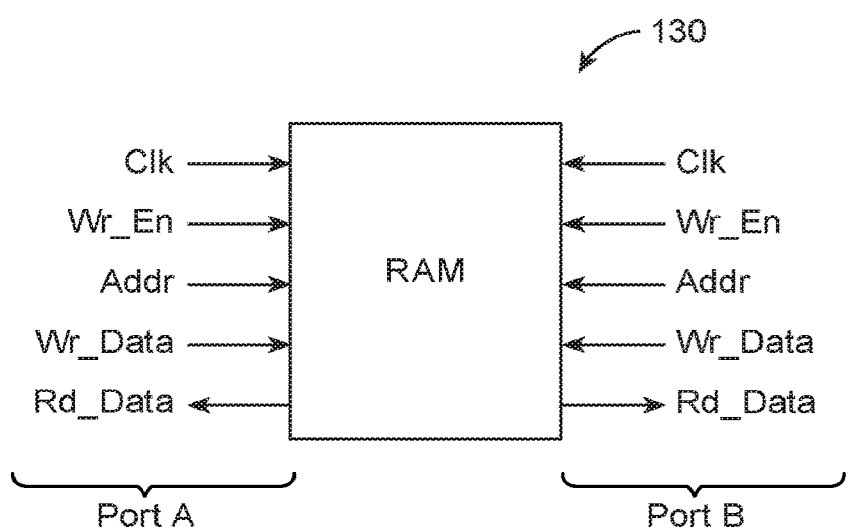
FIG. 6B is a diagram of an illustrative dual-port memory block in accordance with an embodiment.

RAM blocks 130 (sometimes also referred to as "block RAMs") may be single-port or multi-port memory blocks configured to store large amounts of data (e.g., to store at least 10K bits, 20K bits, 20-40K bits, 40-100K bits, or any suitable number of bits). FIG. 6A is a diagram of an illustrative single-port memory block 130. As shown in FIG. 6A, RAM block 130 may receive a clock signal Clk, a write enable signal Wr_En, an address signal Addr, write data Wr_Data, and may output read data Rd_Data. RAM block 130 may also be configured as a dual-port memory block (see, e.g., FIG. 6B). As shown in FIG. 6B, memory block 130 has a first access A and a second access port B, each of which receives and outputs signals similar to those already described above in connection with FIG. 6A.

Figure 6C:
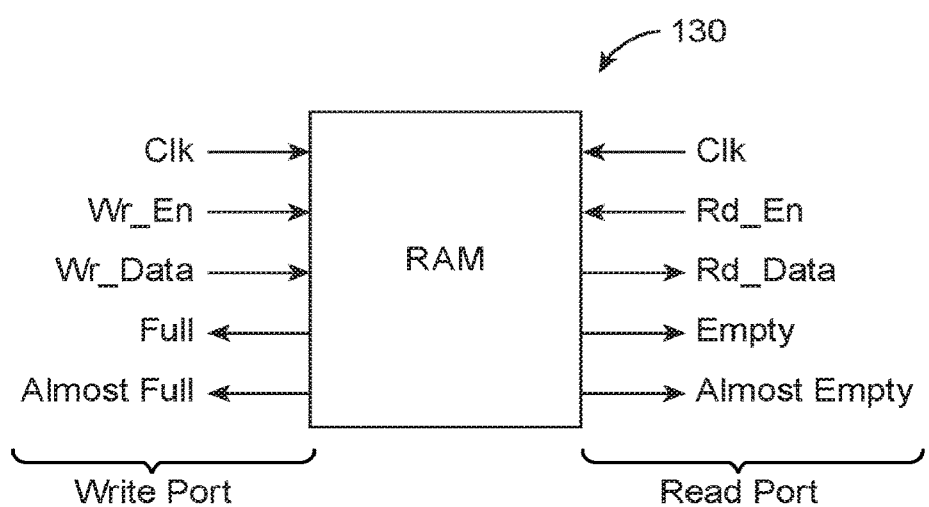
FIG. 6C is a diagram of an illustrative memory block implemented as a first-in first-out (FIFO) circuit in accordance with an embodiment.

In yet another suitable arrangement, RAM block 130 may also be configured as a first-in first-out (FIFO) buffer circuit (see, e.g., FIG. 6C). As shown in FIG. 6C, memory 130 may have a write port and a read port. The write port may receive a clock signal Clk, a write enable signal Wr_En, and write data Wr_Data and may output full and almost full status signals. Similarly, the read port may receive a clock signal Clk and a read enable signal Rd_En and may output read data Rd_Data and empty and almost empty status signals.

The examples of FIGS. 6A-6C in which RAM block 130 may be configured as a single-port memory block, a dual-port memory block, or a FIFO buffer circuit are merely illustrative and are not intended to limit the scope of the present embodiments. If desired, RAM block 130 may have more than two access ports (e.g., block 130 may include three read/write ports, four read/write ports, 4-10 read/write ports, more than 10 read/write ports, etc.). In general, RAM block 130 may be configured as memory for storing data for large LUTs, large amounts of user data, read-only data for calibration purposes, data received from external devices, temporary user data for rate-matching purposes, etc.

DSP blocks 120 (sometimes referred to as "specialized processing blocks" or multiply-accumulate blocks) may include a concentration of circuitry that has been partially or fully hardwired to perform one or more specific tasks, such as a logical or a mathematical operation (e.g., a multiply operation, an add operation, a sum-of-products operation, a dot-vector operation, etc.). A DSP block may also contain one or more specialized structures such as an array of configurable storage elements.

Examples of structures that may be implemented in DSP blocks 120 include: multipliers, adders, accumulators, arithmetic logic units (ALUs), barrel-shifters, various memory elements (such as FIFO/LIFO/SIPO/RAM/ROM/CAM blocks and register files), logic AND/NAND/OR/NOR arrays, etc., or combinations thereof. Storage elements within DSP block 120 may serve different purposes than configuration memory. For instance, storage elements within DSP block 120 may store coefficients for implementing FIR filters, Fourier transforms (e.g., fast Fourier transforms), or other polynomial functions. Alternatively, storage elements within DSP block 120 may be used to pipeline a critical path or to synchronize data before it is processed.

Figure 7A:
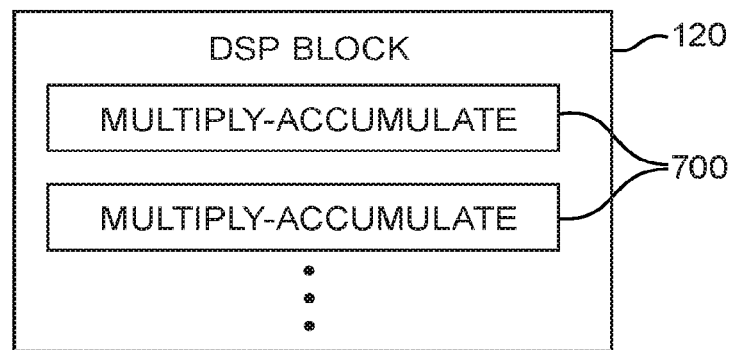
FIG. 7A is a diagram of an illustrative specialized processing block in accordance with an embodiment.
Figure 7B:
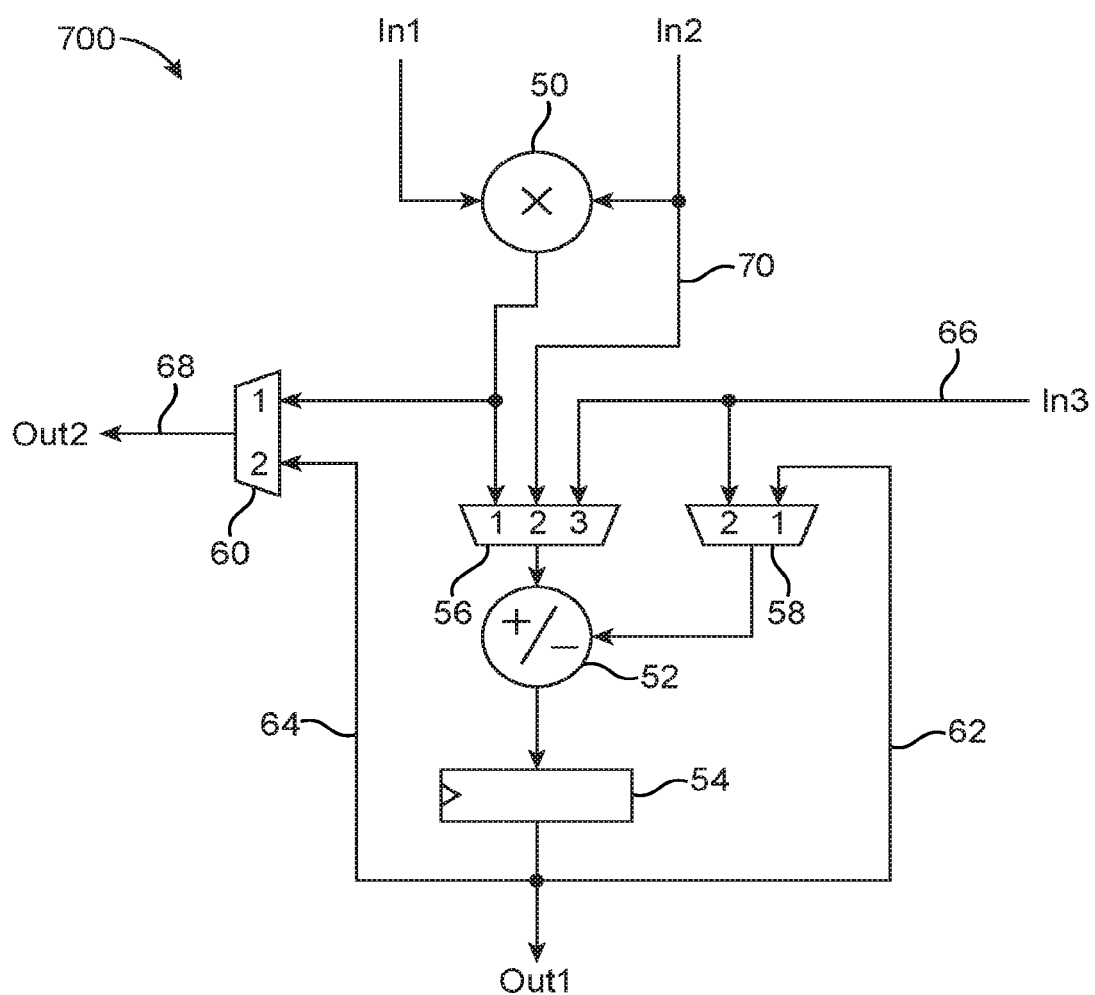
FIG. 7B is a diagram of an illustrative multiply-accumulate circuit in accordance with an embodiment.

In the example of FIG. 7A, specialized processing block 120 may include a plurality of multiply-accumulate circuits 700. FIG. 7B is a diagram showing one suitable implementation of multiply-accumulate circuit 700. As shown in FIG. 7B, multiply-accumulate circuit (MAC) 700 may include multiplier 50, adder 52, routing multiplexers 56, 58, and 60, and register 54. Multiplier 50 may have a first input that receives a first input signal In1, a second input that receives a second input signal In2, and an output at which a corresponding product is generated.

Multiplexer 56 may have a first (1) input that receives the product output from multiplier 50, a second (2) input that directly receives input signal In2 via bypass path 70, a third (3) input that receives a third input signal In3, which can be fed directly from an adjacent multiply-accumulate circuit 700 or specialized processing block 120 via a hardwired direct-connection path 66, and an output. Adder 52 has a first input coupled to the output of multiplexer 56, a second input coupled to the output of multiplexer 58, and an output that feeds into output register 54. Multiplexer 58 may have a first (1) input that receives output signal Out1 from output register 54 and a second (2) input that directly receives signal In3 via path 66.

Multiplexer 680 may have a first (1) input that is directly connected to the output of multiplier 50, a second (2) input that receives Out1 from output register 54 via path 64, and an output at which output signal Out2 is provided. When circuits 700 are connected in series, output signal Out2 may be fed directly to a succeeding circuit 700 or DSP block 120 via hardwired path 68 and shall serve as input signal In3 for the block. The use of fixed direct-connection paths such as paths 66 and 68 between adjacent circuits 700 or DSP blocks 120 helps to reduce routing complexity for external programmable interconnection routing resources that would otherwise be needed to route output signals from one MAC/DSP block to inputs of another MAC/DSP block when multiple blocks are connected in a chain.

The multiply-accumulate circuit 700 of the type shown in FIG. 7B is merely illustrative and does not serve to limit the scope of the present embodiments. In general, specialized processing block 120 may include any number of multipliers, adders, multiplexers, registers, and routing components to perform any suitable type of arithmetic computations for any desired number of input signals.

Figure 8:
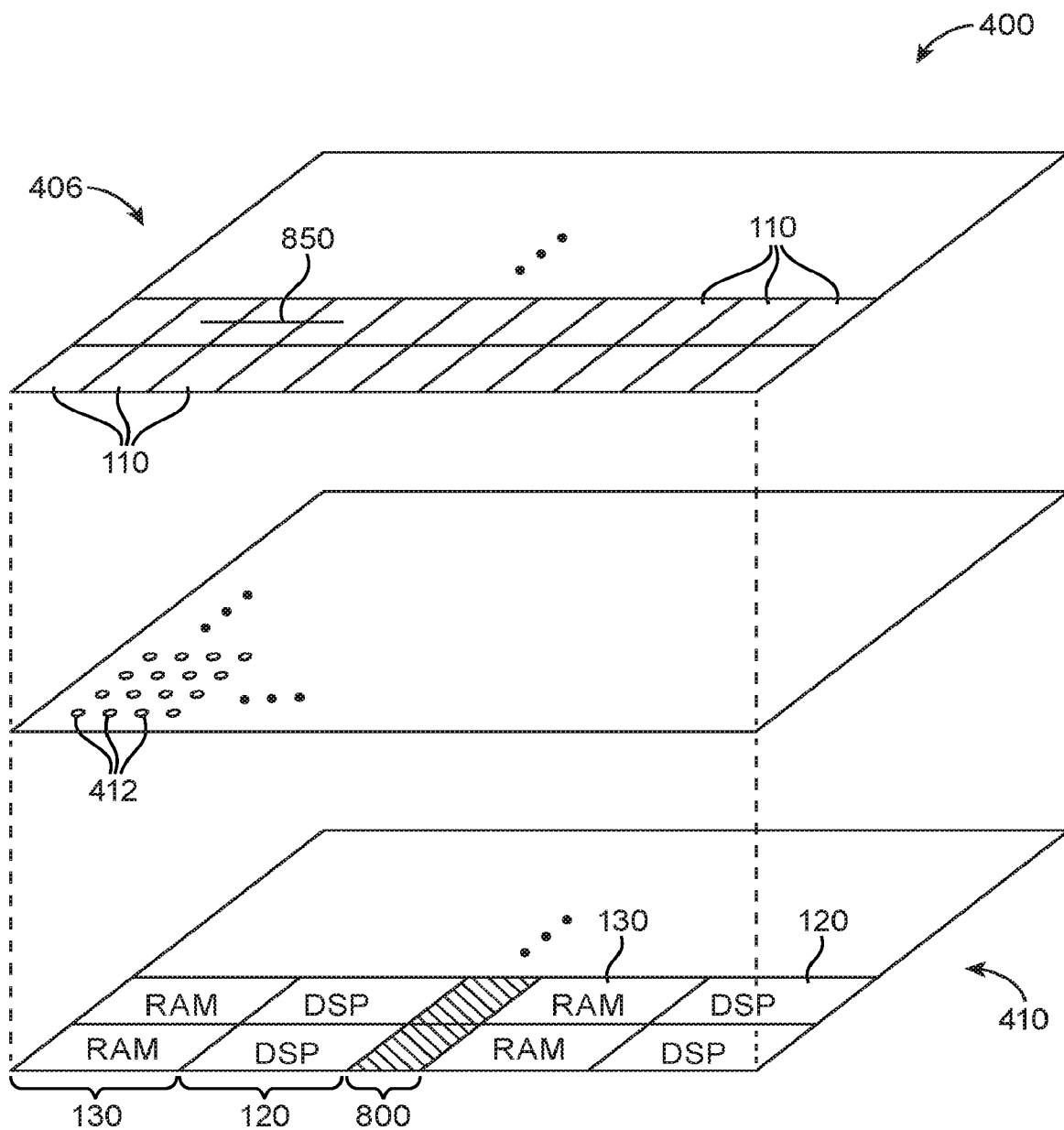
FIG. 8 is an exploded perspective view of the programmable logic device shown in FIG. 4 in accordance with an embodiment.

FIG. 8 is an exploded perspective view of disaggregated programmable device 400 (FIG. 4). As shown in FIG. 8, logic circuitry 406 within the top die may include primarily (or only) configurable logic regions such as LABs (or MLABs) 110. In other words, at least 70-80%, 80-90%, or greater than 90% of the top die may be occupied by logic circuitry such as LABs (e.g., some or all of the core circuitry in the top die is occupied by logic circuitry). On the other hand, circuitry 410 within the bottom die may include primarily (or only) RAM blocks 130, specialized processing blocks 120 (e.g., DSP blocks), and control circuitry 800 (e.g., memory address decoding logic, clocking logic such as phase-locked loops, calibration logic for managing die-to-die variations, debugging logic, and/or other infrastructure-level circuits). In other words, in some embodiments, 70-80%, 80-90%, or greater than 90% of the bottom die may be occupied by RAM block 130 and DSP blocks 120 (e.g., some of all of the core circuitry in the bottom die is occupied by RAM/DSP blocks and associated control circuitry). Each RAM block 130 may be directly overlapped or at least partially covered by two or more LABs 110 (when viewed from the top). Similarly, each DSP block 120 may be directly overlapped or at least partially covered by two or more LABs 110 (when viewed from the top). Control circuitry 800 may also be at least partially covered by one or more LABs 110 when viewed from the top.

Configured in this way, combinational paths such as path 850 conveying a signal from one logic region to another will not need to traverse through the length/width of an unused RAM or DSP block, which can reduce critical path delay and dramatically optimize the performance of programmable device 400. In other words, the combinational paths interconnecting the various logic regions 110 will see interconnect latency that is reduced as a function of the linear dimensions of blocks 120 and 130. Reduction of interconnect lengths reduces capacitive loading, which improves performance by increasing fmax as well as lower power consumption.

Figure 9A:
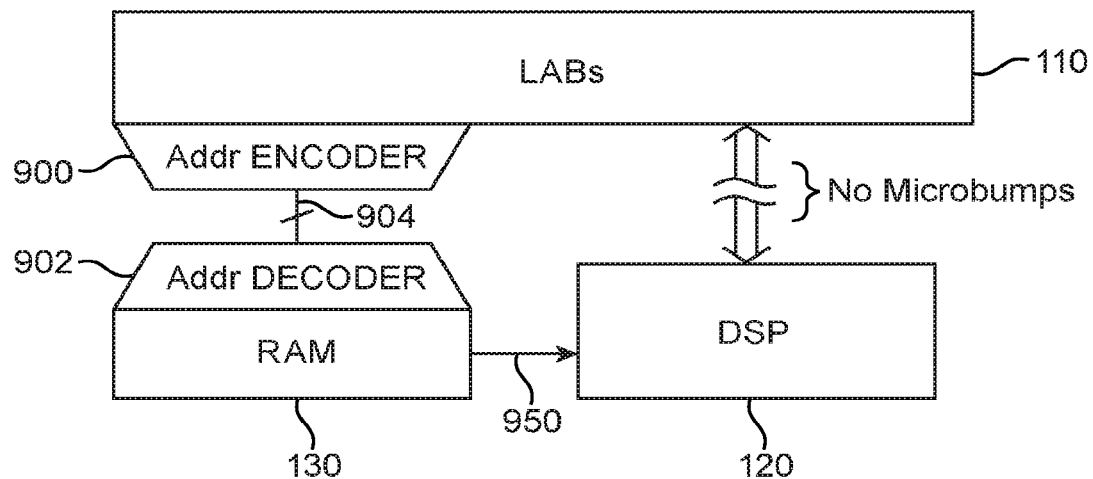
FIGS. 9A and 9B are diagrams showing how programmable logic circuitry communicates with corresponding memory blocks and/or specialized processing blocks via address decoder circuits in accordance with an embodiment.

The microbump array 412 interposed between circuitry 406 in the top die and circuitry 410 in the bottom die may not have sufficient density to provide 1:1 access to each individual memory bit in the memory blocks of the bottom die. Thus, it may be desirable to use an address encoded scheme to access the bits in RAM blocks 130. FIG. 9A is a diagram showing how LABs 110 may use an address encoder 900 that is also formed as part of the top die to generate an encoded address. The encoded address may then be sent down to the bottom die via microbumps 904. The bottom die may include an address decoder 902 (which may be a part of control circuitry 800 of FIG. 8) for decoding the received address bits. The decoded address bits can then be used to address RAM block 130. As an example, twelve address bits may be enough to byte-address an M20K RAM block with 20,000 bits (i.e., 4096 bytes). If desired, a multi-banked memory architecture as seen in CPU cache hierarchies may be used to further improved bandwidth.

Accessing the bottom die in this way will incur latency penalty of the RC delay path between the top die and the bottom die. This delay is currently estimated to be only a single clock cycle. The performance benefit that is gained by this split architecture will be much larger than the performance degradation that is caused because of an additional cycle of latency to access the bottom die.

In some arrangements, DSP accesses are assumed to be always registered. Moreover, DSP blocks 120 might also be fed by RAM blocks 120 as shown by path 950 in FIG. 9A. If DSP blocks 120 in the bottom die are always accessed using RAM blocks 130, it may not be necessary to provide any dedicated microbumps to access DSP blocks 120. In the example of FIG. 9A, there may be no microbumps directly coupling DSP block 120 to any of the LABs 110 above.

Figure 9B:
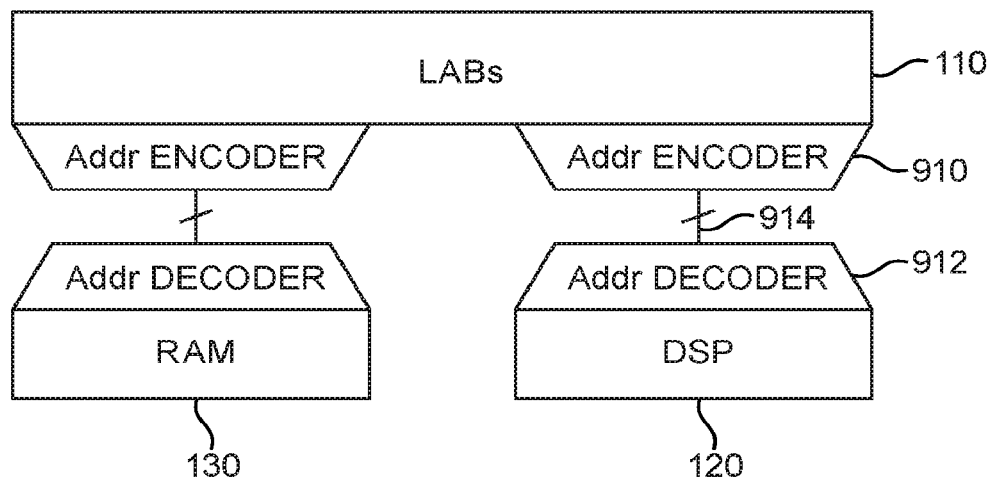

In other suitable arrangements, an encoded scheme may also be provided to access individual multipliers in the DSP blocks 120 (see, e.g., FIG. 9B). As shown in FIG. 9B, LABs 110 may use an address encoder 910 that is also formed as part of the top die to generate an encoded DSP address. The encoded DSP address may then be sent down to the bottom die via microbumps 914. The bottom die may include a DSP address decoder 912 (which may also be a part of control circuitry 800 of FIG. 8) for decoding the received DSP address bits. The decoded address bits can then be used to address DSP block 120 to access individual multipliers or multiply-accumulate circuits. To reduce the limitations of ultra-fine-grained access, DSP blocks 120 that include two multipliers may be grouped into larger macros such that more than 2, 2-10, or more than 10 DSP blocks 120 can be addressed using each set of encoded DSP address bits.

Figure 10:
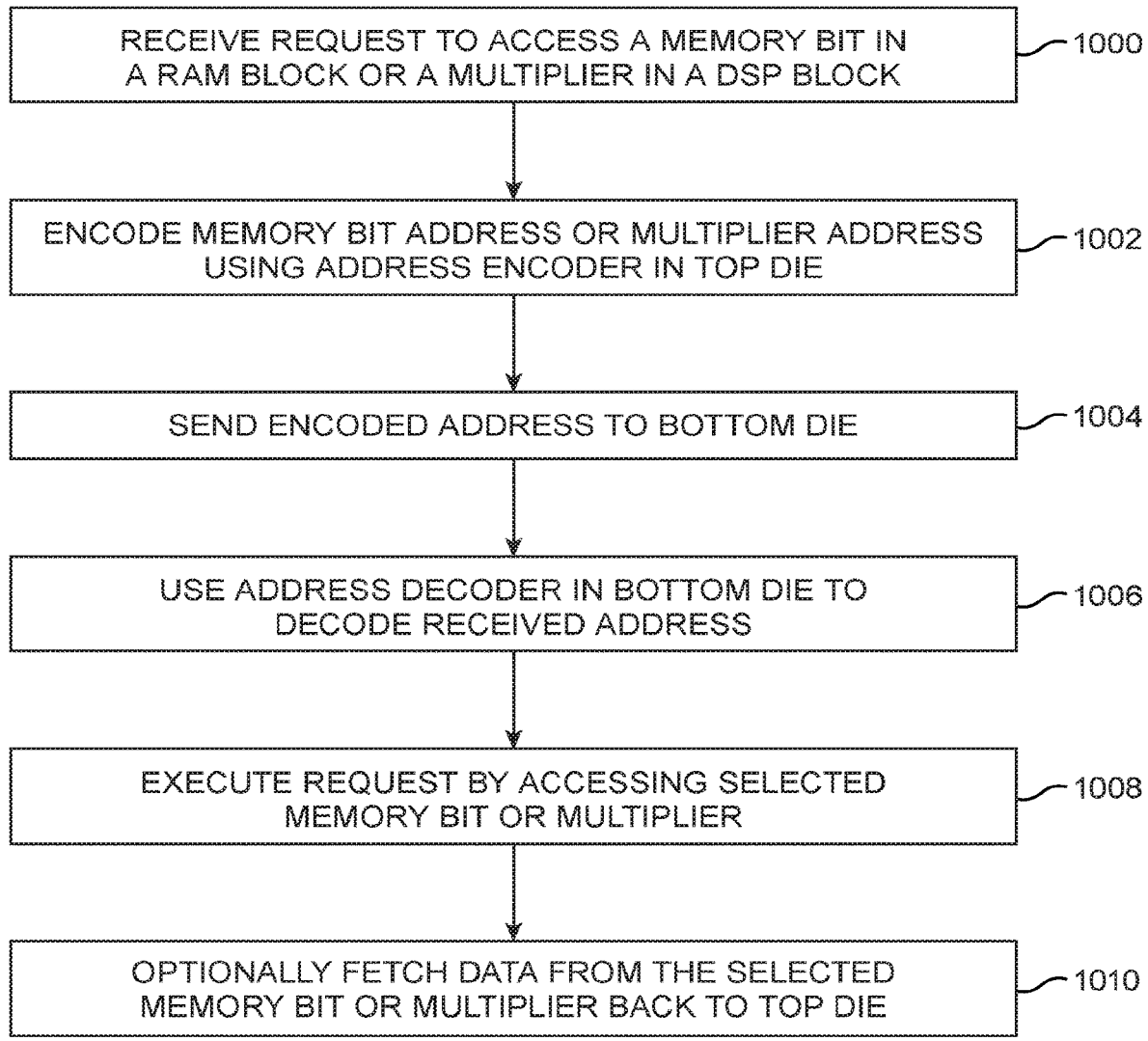
FIG. 10 is a flow chart of illustrative steps for using programmable logic circuitry to communicate with memory and/or specialized processing blocks in accordance with an embodiment.

FIG. 10 is a flow chart of illustrative steps for using LABs 110 in the top die to communicate with the RAM/DSP blocks in the bottom die in accordance with an embodiment. At step 1000, a LAB 110 may receive a request to access a memory byte in a RAM block 130 or a multiplier in a specialized processing block 120.

At step 1002, an address encoder in the top die (e.g., address encoder 900 or 910) may be used to encode the memory bit address or multiplier address. At step 1004, the encoded address may be sent to the bottom die.

At step 1006, an address decoder in the bottom die (e.g., address decoder 902 or 912) may be used to decode the received address. At step 1008, the memory request may be executed by accessing the selected memory byte location or multiplier using the decoded address. At step 1010, data may be optionally fetched from the selected memory bit or multiplier back to the top die.

These steps are merely illustrative and are not intended to limit the present embodiments. At least some of the existing steps may be modified or omitted; some of the steps may be performed in parallel; additional steps may be added or inserted; and the order of certain steps may be reversed or altered.

Figure 11:
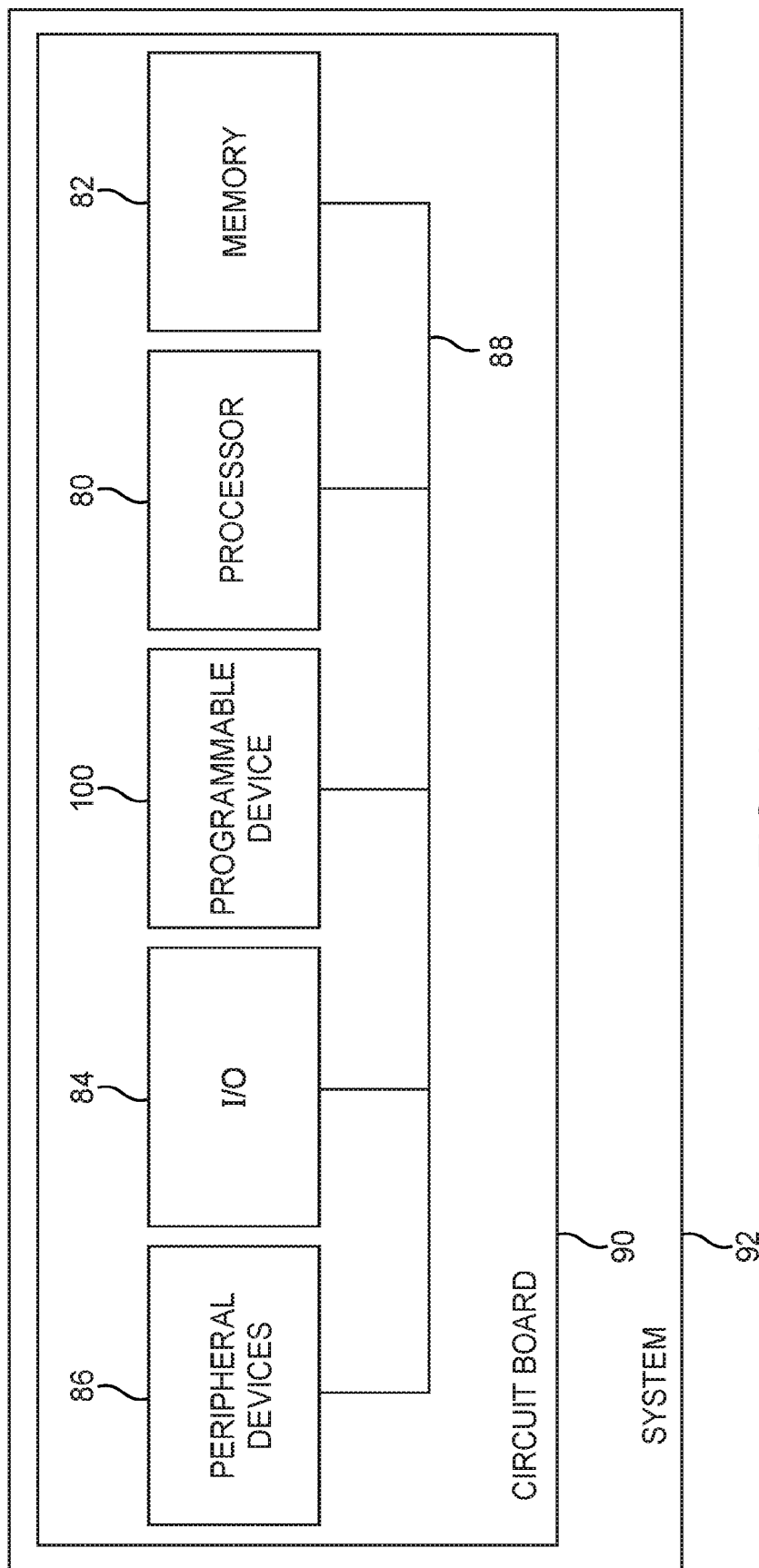
FIG. 11 is a diagram of an illustrative system in which the disaggregated programmable logic device of the present embodiments may be used.

The foregoing embodiments may be made part of a larger system. FIG. 11 shows a programmable device 100 (e.g., device 400 having a disaggregated architecture) in use in data processing system 92. Data processing system 92 may include one or more of the following components: a processor 80 (e.g., a central processing unit or CPU), memory 82 or any suitable type of computer-readable media for storing data or program code, I/O circuitry 84, and peripheral devices 86. These components are coupled together by a system bus 88 and may populate a circuit board 90 that is contained in system 92.

System 92 may be a digital system or a hybrid system that includes both digital and analog subsystems. System 92 may be used in a wide variety of applications as part of a larger computing system, which may include but is not limited to: a data center, a computer networking system, a data networking system, a digital signal processing system, a graphics processing system, a video processing system, a computer vision processing system, a cellular base station, a virtual reality or augmented reality system, a network functions virtualization platform, an artificial neural network, an autonomous driving system, a combination of at least some of these systems, and/or other suitable types of computing systems.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Examples

The following examples pertain to further embodiments.

Example 1 is a device, comprising: a first integrated circuit die that primarily includes logic circuitry; and a second integrated circuit die that primarily includes embedded functional blocks different than the logic circuitry, wherein the first integrated circuit die is stacked vertically with respect to the second integrated circuit die, and wherein the first integrated circuit die is configured to communicate with the second integrated circuit die to perform a custom logic function.

Example 2 is the device of example 1, wherein the second integrated circuit die generates less heat than the first integrated circuit die.

Example 3 is the device of example 2, wherein the first integrated circuit die is stacked on top of the second integrated circuit die, and wherein the first die and the second die are fabricated using different technology nodes.

Example 4 is the device of any one of examples 1-3, wherein the logic circuitry comprises a plurality of logic array blocks.

Example 5 is the device of example 4, wherein the plurality of logic array blocks comprises lookup table and register circuitry.

Example 6 is the device of any one of examples 4-5, wherein the embedded function blocks comprises a plurality of random-access memory blocks.

Example 7 is the device of example 6, wherein the embedded function blocks further comprises a plurality of specialized processing blocks, and wherein the plurality of specialized processing blocks comprises multiplier circuits.

Example 8 is the device of example 7, wherein the first integrated circuit die does not include any random-access memory blocks or specialized processing blocks, and wherein the second integrated circuit die does not include any logic array blocks.

Example 9 is the device of any one of examples 1-8, wherein the first integrated circuit die further comprises an address encoder configured to produce address bits for addressing the embedded functional blocks in the second integrated circuit die.

Example 10 is the device of any one of examples 1-9, wherein the second integrated circuit die further comprises control circuitry, wherein the control circuitry comprises circuits selected from the group consisting of: address decoding logic, clocking logic, calibration logic, and debugging logic, and wherein the first integrated circuit die does not include any such type of control circuitry.

Example 11 is the device of any one of examples 1-10, wherein the second integrated circuit die further comprises input-output elements configured to communicate with devices that are not part of the first integrated circuit die.

Example 12 is a method of operating a device that includes a top die stacked on a bottom die, the method comprising: with an address encoder in the top die, encoding address bits; sending the encoded address bits to the bottom die; and using the encoded address bits to access embedded functional blocks within the bottom die.

Example 13 is the method of example 12, wherein the embedded function blocks comprise random-access memory blocks and specialized processing blocks, and wherein the top die does not include any random-access memory blocks and specialized processing blocks.

Example 14 is the method of example 13, further comprising: with an address decoder in the bottom die, decoding the encoded address bits.

Example 15 is the method of example 14, further comprising: using the decoded address bits to select a memory byte location in one of the random-access memory blocks or to select a multiplier in one of the specialized processing blocks.

Example 16 is the method of example 15, further comprising using microbumps to send the encoded address bits to the random-access memory blocks, wherein there are no microbumps for directly accessing the specialized processing blocks, and wherein the specialized processing blocks are only accessed via the random-access memory blocks.

Example 17 is a system, comprising: a top die having logic array blocks; and a bottom die having memory blocks, wherein the bottom die does not include any logic array blocks, and wherein at least first and second logic array blocks in the top die directly overlaps with one of the memory blocks in the bottom die.

Example 18 is the system of example 17, wherein the top and bottom dies form a programmable device that is are part of a selected one of: a datacenter, a computer networking system, a data networking system, a digital signal processing system, a graphics processing system, a video processing system, a computer vision processing system, a cellular base station, a virtual reality system, an augmented reality system, a network functions virtualization platform, an artificial neural network, and an autonomous driving system.

Example 19 is the system of any one of examples 17-18, wherein the bottom die further comprises digital signal processing (DSP) blocks, and wherein the top die does not include any DSP blocks.

Example 20 is the system of example 19, wherein at least third and fourth logic array blocks in the top die directly overlaps with one of the DSP blocks in the bottom die.

Example 21 is the system of any one of examples 19-20, wherein the bottom die further includes control circuitry, wherein the control circuitry comprises circuits selected from the group consisting of: address decoding logic, clocking logic, calibration logic, and debugging logic, and wherein at least a fifth logic array block in the top die at least partially directly overlaps the control circuitry in the bottom die.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit die, comprising:
   a semiconductor substrate;
   circuitry that is formed on the semiconductor substrate and that includes embedded functional blocks, wherein the embedded functional blocks form at least 70% of all circuitry on the semiconductor substrate; and
   encoding circuitry formed on the semiconductor substrate to:
      receive digital signal processing address data and memory address data;
      encode the digital signal processing address data and the memory address data; and
      transmit the encoded digital signal processing address data and the encoded memory address data.

2. The integrated circuit die of claim 1, wherein the embedded functional blocks comprise memory blocks.

3. The integrated circuit die of claim 1, wherein the embedded functional blocks comprise random-access memory blocks.

4. The integrated circuit die of claim 3, wherein the embedded functional blocks comprise digital signal processing blocks.

5. The integrated circuit die of claim 1, wherein the embedded functional blocks comprise digital signal processing blocks.

6. The integrated circuit die of claim 1, wherein the embedded functional blocks forms at least 80% of all circuitry on the semiconductor substrate.

7. The integrated circuit die of claim 1, wherein the embedded functional blocks forms at least 90% of all circuitry on the semiconductor substrate.

8. The integrated circuit die of claim 1, wherein the circuitry includes at least one circuit selected from the group consisting of: a memory address decoding logic circuit, a clocking logic circuit, a calibration logic circuit, and a debugging logic circuit.

9. A system, comprising:
a first die having configurable logic blocks, wherein the first die comprises encoding circuitry formed on the first die to:
receive digital signal processing address data and memory address data;
encode the digital signal processing address data and the memory address data; and
transmit encoded digital signal processing address data and encoded memory address data; and
a second die having digital signal processing blocks, wherein at least two of the configurable logic blocks in the first die directly overlap with one of the digital signal processing blocks in the second die.

10. The system of claim 9, wherein the first die is stacked on the second die.

11. The system of claim 9, wherein the configurable logic blocks form at least 70% of all circuitry on the first die.

12. The system of claim 9, wherein the second die does not include any configurable logic blocks.

13. The system of claim 9, wherein the first die and the second die form a programmable device that is part of a selected one of: a datacenter, a computer networking system, a data networking system, a digital signal processing system, a graphics processing system, a video processing system, a computer vision processing system, a cellular base station, a virtual reality system, an augmented reality system, a network functions virtualization platform, an artificial neural network, and an autonomous driving system.

14. The system of claim 9, wherein the configurable logic blocks comprise logic array blocks (LABs).

15. A system, comprising:
a first die having configurable logic blocks, wherein the first die comprises encoding circuitry formed on the first die to:
receive digital signal processing address data and memory address data;
encode the digital signal processing address data and the memory address data; and
transmit encoded digital signal processing address data and encoded memory address data; and
a second die having digital signal processing blocks, wherein the first and second die are stacked with the first die on top of the second die, and wherein at least two of the configurable logic blocks in the first die directly overlap with one of the digital signal processing blocks in the second die when viewed from a top-down view of the stacked first and second die.

16. The system of claim 15, wherein receiving the digital signal processing address data and the memory address data comprises receiving the digital signal processing address data and the memory address data from the second die.

17. The system of claim 16, wherein transmitting the encoded digital signal processing address data and encoded memory address data comprises transmitting the encoded digital signal processing address data and the encoded memory address data to the second die.

18. The system of claim 15, wherein the second die does not include any configurable logic blocks.

19. The system of claim 15, wherein the first die and the second die form a programmable device that is part of a selected one of: a datacenter, a computer networking system, a data networking system, a digital signal processing system, a graphics processing system, a video processing system, a computer vision processing system, a cellular base station, a virtual reality system, an augmented reality system, a network functions virtualization platform, an artificial neural network, and an autonomous driving system.

20. The system of claim 15, wherein the configurable logic blocks comprise logic array blocks (LABs).

* * * * *